(12) United States Patent
Schreiber et al.

(10) Patent No.: US 11,137,450 B2
(45) Date of Patent: Oct. 5, 2021

(54) METHOD OF DETERMINING A STATE OR A STATE CHANGE OF AN ELECTROCHEMICAL ENERGY STORAGE DEVICE AND ENERGY STORAGE DEVICE PREPARED THEREFOR

(71) Applicants: VW Kraftwerk GmbH, Wolfsburg (DE); VARTA Microbattery GmbH, Ellwangen Jagst (DE)

(72) Inventors: Werner Schreiber, Meine (DE); Andreas Huth, Vechelde (DE); Ralf Keppeler, Westhausen (DE)

(73) Assignees: VW Kraftwerk GmbH, Wolfsburg (DE); VARTA Microbattery GmbH, Ellwangen Jagst (DE)

( * ) Notice: Subject to any disclaimer, the term of this patent is extended or adjusted under 35 U.S.C. 154(b) by 80 days.

(21) Appl. No.: 16/633,203

(22) PCT Filed: Jul. 20, 2018

(86) PCT No.: PCT/EP2018/069749
§ 371 (c)(1),
(2) Date: Jan. 23, 2020

(87) PCT Pub. No.: WO2019/037975
PCT Pub. Date: Feb. 28, 2019

(65) Prior Publication Data
US 2021/0148982 A1 May 20, 2021

(30) Foreign Application Priority Data
Aug. 23, 2017 (DE) ............ 10 2017 214 770.9

(51) Int. Cl.
*G01R 31/389* (2019.01)
*G01R 31/382* (2019.01)
(Continued)

(52) U.S. Cl.
CPC ......... *G01R 31/389* (2019.01); *G01R 31/382* (2019.01); *H01M 10/486* (2013.01); *H01M 50/124* (2021.01)

(58) Field of Classification Search
CPC . G01R 31/389; G01R 31/382; H01M 50/124; H01M 10/486; H01M 50/116; H01M 50/557; H01M 10/48; Y02E 60/10
See application file for complete search history.

(56) References Cited

U.S. PATENT DOCUMENTS

| 4,127,681 | A | * | 11/1978 | Ferren | ............... | H01G 7/02 |
| | | | | | | 252/500 |
| 4,223,062 | A | * | 9/1980 | Hession | .......... | G03G 5/022 |
| | | | | | | 346/135.1 |
| 4,771,362 | A | * | 9/1988 | Behn | ............. | H01G 4/145 |
| | | | | | | 29/25.42 |

(Continued)

FOREIGN PATENT DOCUMENTS

| CA | 1266504 | A | * | 3/1990 | ......... | H01M 10/16 |
| CN | 102804303 | A | * | 11/2012 | ......... | H01M 14/00 |

(Continued)

*Primary Examiner* — Tung S Lau
(74) *Attorney, Agent, or Firm* — DLA Piper LLP (US)

(57) ABSTRACT

A method of determining a state or a state change of an electrochemical energy storage device that includes a housing composed of a multilayer composite film, wherein the housing includes a first housing part and a second housing part composed of the multilayer composite film, which parts are joined to one another, and together enclose a hollow space in which the composite is arranged, and the composite film includes a ply composed of a metal layer and also two plies composed of polymer, with the metal layer being arranged between the two polymer plies, wherein to determine the state or the state change, an electric potential is applied to the metal layers of the first housing part and the second housing part so that an electric field arises between the metal layers and an electrical parameter influenced by a change of a spacing between the metal layers is determined.

4 Claims, 1 Drawing Sheet

(51) Int. Cl.
*H01M 50/124* (2021.01)
*H01M 10/48* (2006.01)

(56) References Cited

U.S. PATENT DOCUMENTS

| | | | |
|---|---|---|---|
| 4,975,315 A * | 12/1990 | Bothe | B32B 7/12 428/216 |
| 5,291,066 A * | 3/1994 | Neugebauer | H01L 23/10 257/750 |
| 5,455,459 A * | 10/1995 | Fillion | H01L 23/5389 174/262 |
| 8,405,901 B2 * | 3/2013 | Boote | B32B 17/10788 359/320 |
| 2009/0246607 A1 | 10/2009 | Shinyashiki et al. | |
| 2010/0129663 A1 * | 5/2010 | Salnikov | B64D 45/02 428/413 |
| 2010/0136393 A1 | 6/2010 | Takezawa et al. | |
| 2010/0259866 A1 * | 10/2010 | Shaffer | H01G 11/52 361/502 |
| 2010/0263898 A1 * | 10/2010 | Hebert | B64C 1/12 174/2 |
| 2011/0170170 A1 * | 7/2011 | Boote | B32B 17/10174 359/296 |
| 2016/0268649 A1 | 9/2016 | Heo et al. | |
| 2018/0162104 A1 * | 6/2018 | Chamberlain | B32B 17/10174 |

FOREIGN PATENT DOCUMENTS

| | | | | |
|---|---|---|---|---|
| CN | 105051944 A | * | 11/2015 | H01M 4/0402 |
| CN | 105122501 A | * | 12/2015 | H01M 4/13 |
| DE | 10 2011 120 505 A1 | | 6/2013 | |
| DE | 102012107848 A1 | * | 5/2014 | B32B 5/024 |
| DE | 112012006276 T5 | * | 2/2015 | H01G 11/02 |
| WO | 2014/129855 A1 | | 8/2014 | |

* cited by examiner

METHOD OF DETERMINING A STATE OR A STATE CHANGE OF AN ELECTROCHEMICAL ENERGY STORAGE DEVICE AND ENERGY STORAGE DEVICE PREPARED THEREFOR

TECHNICAL FIELD

This disclosure relates to a method of determining a state or a state change of an electrochemical energy storage device having a housing composed of a multilayer composite film and an electrochemical energy storage device prepared for the method.

BACKGROUND

Electrochemical energy storage devices comprise at least one, frequently also two or more, electrochemical energy storage cell(s). If an electrochemical energy storage device comprises a plurality of energy storage cells, they are generally connected to one another in parallel and/or in series. An electrochemical energy storage cell in turn comprises an arrangement made up of at least one positive electrode and at least one negative electrode and a separator arranged inbetween, in the simplest arrangement precisely one positive electrode, precisely one negative electrode and precisely one separator arranged inbetween.

On discharging an electrochemical energy storage cell, an energy-supplying chemical reaction made up of two electrically coupled but spatially separated subreactions takes place. A subreaction taking place at a comparatively lower redox potential proceeds at the negative electrode, while a subreaction proceeds at a comparatively higher redox potential at the positive electrode. During discharging, electrons are liberated at the negative electrode by an oxidation process, resulting in an electron current, usually via an external load, to the positive electrode by which a corresponding number of electrons is taken up. A reduction process thus takes place at the positive electrode. At the same time, an ion current corresponding to the electrode reaction arises within the cell. This ion current is ensured by an ionically conductive electrolyte. In secondary electrochemical energy storage cells, such a discharging reaction is reversible, i.e., there is the possibility of reversing the conversion of chemical energy into electric energy that has occurred during discharging. When the terms anode and cathode are used in this context, the electrodes are generally named according to their function during discharging. The negative electrode in such energy storage cells is thus the anode, while the positive electrode is the cathode.

Among known secondary electrochemical energy storage cells, comparatively high energy densities are achieved especially by energy storage cells based on lithium ions. The electrodes of energy storage cells based on lithium ions are usually present in the form of layers. Together with at least one separator layer, they form a composite of sheet-like electrode and separator layers. The composite can be wound up in a spiral manner. However, in many arrangements the electrodes and the at least one separator are also stacked flat on top of one another. In particular, a plurality of energy storage cells based on lithium ions can also be stacked on top of one another in an energy storage device.

The electrodes of secondary electrochemical energy storage cells based on lithium ions usually comprise metallic current collectors mostly present in the form of foils, nets, meshes, foams, nonwovens or felts. In the positive electrode, nets or foils composed of aluminum, for example, made of aluminum expanded metal or an aluminum foil, are usually employed as current collectors. On the side of the negative electrode, nets or foils composed of copper are usually employed as current collectors.

In general, energy storage cells based on lithium ions are produced in a multistage process. It is usual for the sheet-like electrodes to be produced in a first step to then be combined subsequently with one or more separators to give the abovementioned electrode-separator composites. To produce an energy storage cell, electrodes and separators can be stacked or wound loosely or else joined to one another in a lamination step. Finally, the cells produced are usually packed in a liquid-tight housing and impregnated with an electrolyte.

To produce the sheet-like electrodes, thin electrode films are formed from usually paste-like compositions comprising a suitable electrochemically active material ("active material") on the current collectors, for example, by a doctor blade or a slot die. Active materials suitable for the electrodes of an energy storage cell based on lithium ions have to be able to take up and subsequently release lithium ions that migrate from the negative electrode to the positive electrode (and vice versa) during charging and discharging.

Active materials suitable for negative electrodes of energy storage cells based on lithium ions are, in particular, graphitic carbon or nongraphitic carbon materials capable of intercalating lithium. Furthermore, metallic and semimetallic materials that can be alloyed with lithium can also be employed. Thus, for example, the elements tin, antimony and silicon are able to form intermetallic phases with lithium. In particular, the carbon-based active materials can also be combined with the metallic and/or semimetallic materials.

Materials suitable for the positive electrodes are, in particular, lithium-cobalt oxide (LCO) having the empirical formula $LiCoO_2$, lithium-nickel-manganese-cobalt oxide (NMC) having the empirical formula $LiNi_xMn_yCo_zO_2$, lithium-manganese spinel (LMO) having the empirical formula $LiMn_2O_4$, lithium-iron phosphate (LFP) having the empirical formula $LiFePO_4$ or lithium-nickel-cobalt-aluminum oxide having the empirical formula $LiNi_xCo_yAl_zO_2$ (NCA). Mixtures of the materials mentioned can also be used.

Apart from the active materials, the compositions generally also contain an electrode binder, a conductivity improver, a solvent and/or suspension medium and optionally further additives, for example, to influence the processing properties of the compositions. An electrode binder forms a matrix into which the active material and optionally the conductivity improver can be incorporated. The matrix is intended to ensure increased structural stability during the volume expansions and contractions caused by lithiation and delithiation. Possible solvents and/or suspension media are, for example, water or organic solvents such as N-methyl-2-pyrrolidone (NMP) or N-ethyl-2-pyrrolidone (NEP). An example of an aqueously processable binder is sodium carboxymethyl cellulose (Na-CMC). An example of a binder that can be processed in organic solvents is polyvinylidene difluoride (PVDF). As additives, it is possible to add, for example, rheological auxiliaries. The conductivity improver is usually an electrically conductive carbon-based material, in particular conductive carbon black, conductive graphite, carbon fibers or carbon tubes.

Solvent and/or suspension medium present in the composition is usually still present in the electrode films formed on the current collectors and has to be removed. The dry electrode films can then be densified, for example, in a calendering process. The electrodes formed in this way can be assembled to form the abovementioned energy storage cells based on lithium ions, which can in turn be assembled to give energy storage devices.

In the production of an energy storage device based on lithium ions, it is possible to pack one or more energy storage cells based on lithium ions into a housing composed of a multilayer composite film. Such a housing is typically made of two housing parts consisting of the composite film. They are, for example, joined to one another in a sealing manner by an adhesive or sealing layer so that essentially no moisture can penetrate from the outside into the housing and any liquid electrolyte present in the housing cannot escape. The housing films are particularly preferably aluminum composite films, for example, with the sequence polyamide/aluminum/polypropylene.

Before closure of the housing, the at least one energy storage device is impregnated with a suitable electrolyte. An organic electrolyte, for example, one based on organic carbonates is required for energy storage cells based on lithium ions.

As a result of mechanical damage or inappropriate handling of an energy storage cell based on lithium ions, the cell can attain an incorrect state (cell temperature>maximum operating temperature, electrolyte decomposition) in which operational safety is no longer guaranteed. It is important to recognize such incorrect states in good time to be able to switch off affected cells if necessary.

It could therefore be helpful to provide a simple technical solution enabling determination of states or state changes of an electrochemical energy storage device.

SUMMARY

We provide a method of determining a state or a state change of an electrochemical energy storage device including a composite of at least one positive sheet-like electrode, at least one negative sheet-like electrode and at least one separator layer, a housing composed of a multilayer composite film, wherein the housing includes a first housing part and a second housing part composed of the multilayer composite film, which parts are joined to one another, and together enclose a hollow space in which the composite is arranged, and the composite film includes a ply composed of a metal layer and also two plies composed of polymer, with the metal layer being arranged between the two polymer plies, wherein to determine the state or the state change, an electric potential is applied to the metal layers of the first housing part and the second housing part so that an electric field arises between the metal layers and an electrical parameter influenced by a change of a spacing between the metal layers is determined.

We also provide an electrochemical energy storage device including a composite of at least one positive sheet-like electrode, at least one negative sheet-like electrode and at least one separator layer, a housing composed of a multilayer composite film, wherein the housing includes a first housing part and a second housing part composed of the multilayer composite film, which parts are joined to one another, and together enclose a hollow space in which the composite is arranged, the composite film includes a ply composed of a metal layer and two plies composed of polymer, with the metal layer being arranged between the two polymer plies, and the housing parts each include a contact region for electrically connecting an electric conductor to the respective metal layer.

DETAILED DESCRIPTION

Figure 1:
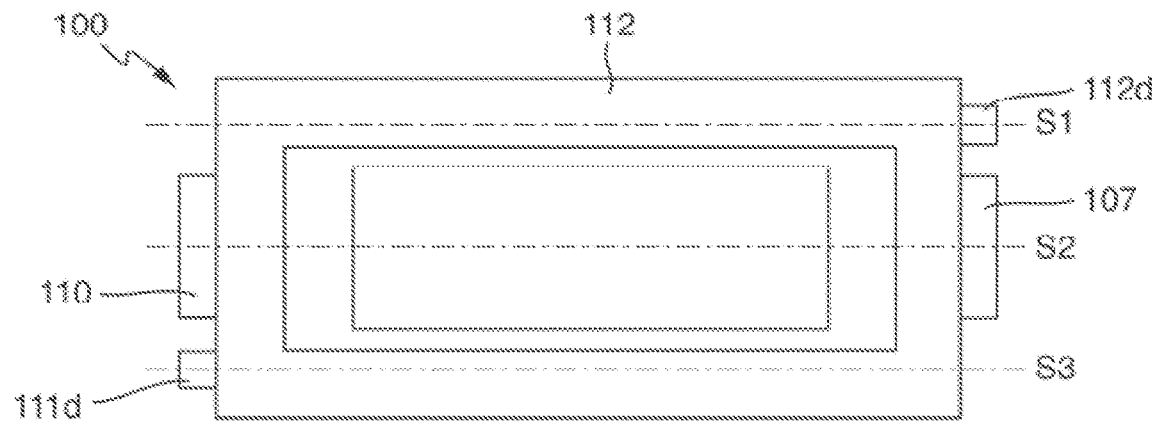
FIG. 1 is a plan view of a schematic illustration of an example of an energy storage device.

Our method determines a state or a state change of an electrochemical energy storage device characterized by the following features:

The energy storage device comprises a composite of at least one positive sheet-like electrode, at least one negative sheet-like electrode and at least one separator layer.

The energy storage device comprises a housing composed of a multilayer composite film.

The housing comprises a first housing part and a second housing part composed of the multilayer composite film, which parts are joined to one another, preferably at their peripheries, and together enclose a hollow space in which the composite is arranged.

The composite film comprises a ply composed of a preferably continuous metal layer and also two plies composed of polymer, with the metal layer being arranged between the two polymer plies.

The energy storage device is particularly preferably an energy storage device based on lithium ions, i.e., comprises at least one energy storage cell having at least one lithium-intercalating electrode.

Energy storage devices having these features are, as can be seen from the statements above, already known. In principle, the method is applicable to all known lithium ion-based energy storage devices. The only prerequisite is that the energy storage devices have a housing composed of a multilayer composite film having a ply composed of a metal layer, as defined herein.

An electric potential is applied to the metal layers of the first housing part and the second housing part to determine the state or the state change of the energy storage device. The metal layers of the first housing part and the second housing part can since they are electrically insulated from one another, function as electrodes of a capacitor and statically store electric energy. When the metal layers are connected to the poles of a voltage source, electrons are taken from one of the metal layers and accumulated on the other metal layer, which means that an electric charge Q is translocated from the one metal layer to the other metal layer. This translocation builds up an electric field E between the metal layers. As soon as the field has been built up, it is possible to determine an electrical parameter which is influenced by a change in a distance between the metal layers.

Determination of the state or the state change of the energy storage device is particularly preferably carried out in one of the three following ways:

An electrical capacitance between the metal layer of the first housing part and the metal layer of the second housing part or a change in this capacitance is determined as electrical parameter.

An electric potential prevailing between the metal layers or a change in this potential is determined as electrical parameter.

A capacitive impedance of the metal layers forming the electric field or a change in this impedance is determined as electrical parameter.

All these electric parameters depend indirectly or directly on the distance between the metal layers. As a result, a change in the distance between the metal layers can be concluded from a change in these parameters.

It is known that the functional properties of a capacitor, in particular its capacitance, depend on a series of parameters, for example:

the temperature of the capacitor,
the area of the electrodes of the capacitor,
the distance between the electrodes of the capacitor, and
the dielectric constant of a dielectric arranged between the electrodes.

In our arrangement, at least two layers of polymer are present between the metal layers of the first housing part and the second housing part. Both the thickness of this polymer layer and also its nature thus has an influence on the capacitance of a capacitor formed by the two metal layers.

If, for example, the distance between the metal layers changes, this has effects on a potential difference between the metal layers. A voltage change can be detected and makes it possible to draw a corresponding conclusion in respect of a change in the distance between the metal layers. An analogous situation applies to the capacitance and the capacitive impedance of the metal layers forming the electric field. A change in the capacitance or the impedance can indicate a change in the distance between the metal layers.

The determination of the capacitance can be carried out according to known procedures, in particular by one of the following procedures:

charging the two metal layers at constant current and observation of the rate at which the voltage increases, measurement of the resonant frequency of an LC oscillator circuit formed with the capacitance, and application of an AC voltage and measurement of the profile of the current.

The latter procedure is also suitable for determining capacitive impedances. It is employed in many commercial capacitance measuring instruments. Commercial multimeters or any other measuring instrument suitable for this purpose are suitable for use in our method.

Preferably, the state to be determined is a charging state of the electrochemical energy storage device. The electrodes of electrochemical energy storage devices, in particular energy storage devices based on lithium ions, are subject to not inconsiderable volume changes during operation in charging and discharging processes. This means that the external dimensions of energy storage devices can change during charging and discharging. In energy storage devices having a housing made up of two housing parts composed of a multilayer composite film, the housing parts are frequently in direct two-dimensional contact with the electrodes. If one electrode expands during a charging process, a housing film in contact with the electrode changes its positions. On average, the distance between the housing parts and the metal layers present therein changes as a result. This has, as explained above, a direct influence on an electric field existing between the metal layers. Consequently, measured capacitance values, for example, can be linked to average spacings of housing films and with charge states of electrochemical energy storage devices.

Further preferably, the state to be determined is an incorrect state resulting from a temperature increase or gas formation in the electrochemical energy storage device. Such incorrect states occur during operation as a result of, in particular, mechanical defects or overcharging. Temperature increases lead to thermal expansion of electrodes and electrolyte and correspondingly to swelling of composite film housings. Instances of gas formation, for example, as a consequence of electrolyte decomposition, lead to the same result. The associated changes in the spacings of housing parts can in turn easily be detected by measuring capacitance, impedance or voltage changes.

Still further preferably, the state to be determined is a temperature of the electrochemical energy storage device. Temperature increases do not necessarily occur as a consequence of an incorrect state. Rather, temperature fluctuations frequently occur during normal operation, for example, during charging processes. Such temperature fluctuations can also be detected and quantified.

However, the method can be used not only for monitoring parameters that can be of interest during ongoing operation of electrochemical energy storage devices. Rather, it can be useful as early as in the production of the energy storage devices, for instance in the monitoring of adherence to production parameters.

Preferably, the state to be determined is the qualitative state of an adhesive layer or sealing layer between the first housing part and the second housing part: as has already been indicated above, the housing parts to be combined may be joined to one another by an adhesive or sealing layer in the production of composite film housings. The thickness of the adhesive and sealing layer may also determine the spacing between the two metal layers. The thinner the adhesive and sealing layer, the smaller the spacing. Under production conditions, it is possible for an adhesive and sealing layer to be made too thin or too thick. This can be detected according to the method.

A similar situation applies to the qualitative state of the layers of polymer of the composite film of the first housing part or the second housing part. If the layers have, for example, nonuniform thicknesses or defects, this affects the spacing between the metal layers. Further preferably, the state to be determined is therefore the qualitative state of the layers of polymer of the composite film of the first housing part or the second housing part.

Our electrochemical energy storage device shares the following features with known energy storage devices:

it comprises a composite of at least one positive sheet-like electrode, at least one negative sheet-like electrode and at least one separator layer, it comprises a housing composed of a multilayer composite film, the housing comprises a first housing part and a second housing part composed of the multilayer composite film, which parts are joined to one another, preferably at their peripheries, and together enclose a hollow space in which the composite is arranged, and the composite film comprises a ply composed of a metal layer and also two plies composed of polymer, with the metal layer being arranged between the two polymer plies.

In contrast to known energy storage devices, our electrochemical energy storage device has specific modifications that make it possible to carry out our method. It is characterized in that the housing parts each comprise a contact region for electrically connecting an electric conductor to the respective metal layer.

The contact regions enable the required electric potential to be applied to the metal layers of the first housing part and the second housing part. In particular, they allow a measuring instrument to be connected via electric contacts to the metal layers to determine the electrical parameter that can be influenced by a change in a spacing between the metal layers.

As regards possible preferred examples of the at least one positive electrode, the at least one negative electrode and the at least one separator layer and also the housing composed of the multilayer composite film and the housing parts, reference is made to the introductory explanations in respect of known energy storage devices based on lithium ions and the components thereof. Thus, our energy storage device preferably comprises an energy storage cell based on lithium ions as described at the outset, particularly preferably also a plurality thereof. These may be stacked on top of one another within the housing.

The metal layers are particularly preferably aluminum layers. The plies composed of polymer are, for example, polyamide and polypropylene.

The electrochemical energy storage device is preferably characterized by at least one of the following additional features:
  the metal layer has two areal sides and a circumferential periphery,
  the metal layer has a substantially constant thickness,
  at least one of the contact regions is a region on one of the two areal sides which is not covered by a polymer ply,
  at least one of the contact regions is an area on a separate metallic connection contact electrically connected to the circumferential periphery of the metal layer or one of the areal sides thereof, in particular by welding, and
  at least one of the contact regions is an area on at least one separate metallic connection contact which penetrates through the composite film of one of the housing parts and electrically contacts the metal layer present therein.

In general, the size of the two areal sides corresponds exactly to the size of the housing parts that together form the housing of the energy storage device. The thickness of the metal layer is preferably 20 to 100 µm. The composite film preferably has a total thickness of 70 to 300 µm. The thickness of the polymer plies which cover the metal layer is preferably 25 to 100 µm.

It is advantageous for the contact region to encompass a two-dimensional area against which an electric conductor can be pressed to establish a reliable electrical contact. The area preferably has a size of at least 1 mm$^2$, preferably at least 4 mm$^2$, particularly preferably at least 16 mm$^2$, in particular at least 25 mm$^2$.

To provide a contact region, it is possible, for example, for regions of one of the polymer plies of the composite film to be removed from the metal layer. Furthermore, the separate metallic connection contact can be molded onto the metal layer, for example, by welding.

The separate connection contact that penetrates through the composite film can be, for example, a needle or a nail.

Particularly when the energy storage device comprises more than one energy storage cell, it has, preferably, an electric conductor electrically connected to the at least one positive electrode and is fed out from the hollow space and also an electric conductor electrically connected to the at least one negative electrode and is fed out from the hollow space. Preferably, these conductors are fed outward through a sealing layer.

Further features, details and preferred forms are derived from the appended claims and the abstract, the wording of both of which is incorporated by reference into the description, and the following description of preferred examples and also with the aid of the drawings.

Figure 2:
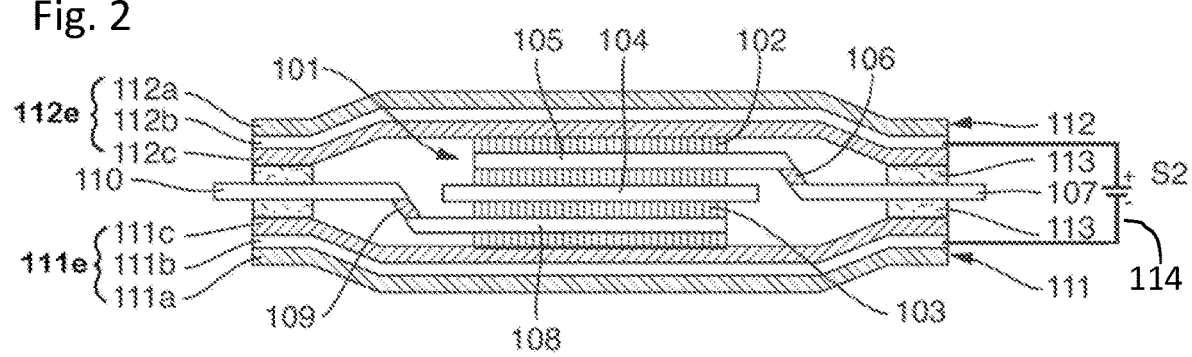
FIG. 2 is a schematic sectional view taken along the line S2 in FIG. 1.
Figure 3:
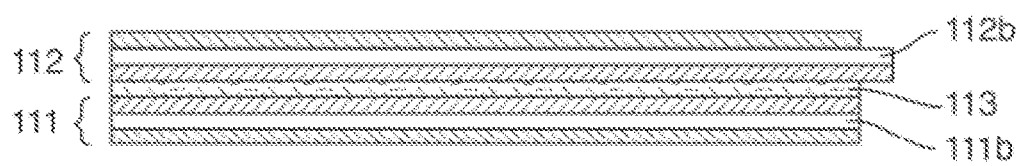
FIG. 3 is a schematic sectional view taken along the line S1 in FIG. 1.
Figure 4:
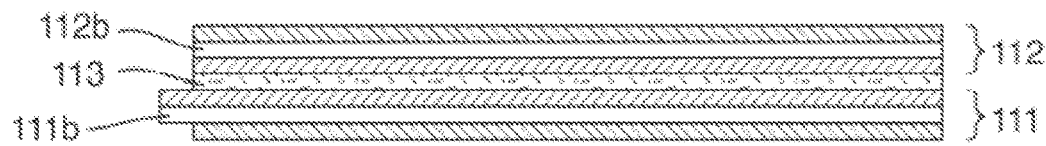
FIG. 4 is a schematic sectional view taken along the line S3 in FIG. 1.

The energy storage device 100 depicted in FIGS. 1-4 comprises a composite 101 made up of at least one positive sheet-like electrode 102, at least one negative sheet-like electrode 103 and at least one separator layer 104 arranged between the electrodes 102 and 103. The current collector 105 is embedded in the positive sheet-like electrode 102 and covered on both sides with active material. It is connected via the welded connection 106 to the electric conductor 107. The current collector 108 is embedded in the negative sheet-like electrode 103 and covered on both sides with active material. It is connected via the welded connection 109 to the electric conductor 110. The composite 101 is arranged in a hollow space formed by a first housing part 111 and a second housing part 112. The housing parts 111 and 112 each consist of a multilayer composite film 111e and 112e. In the housing part 111, this comprises the metal layer 111b and also the polymer plies 111a and 111c. In the housing part 112, this comprises the metal layer 112b and the polymer plies 112a and 112c. The housing parts 111 and 112 are joined to one another at their peripheries via the sealing layer 113. The electric conductors 107 and 110 are each fed out from the housing formed by the housing parts 111 and 112. Via them, the electrodes 102 and 103 can be electrically contacted from outside the housing.

The housing parts 111 and 112 each comprise a contact region 111d and 112d for electrical connection of an electric conductor to the respective metal layer 111b and 112b. To provide the contact regions 111d and 112d, regions of the polymer plies 111a and 112a have been removed from the metal layers 111b and 112b. The position of the contact regions can be varied according to requirements. Thus, the contact regions 111d and 112d can, for example, both be positioned on one side of the housing formed by the housing parts 111 and 112.

When an electric potential is applied to the contact regions 111d and 112d by voltage source 114, an electric field is formed between the metal layers 111b and 112b. The metal layers 111b and 112b behave approximately like the plates of a plate capacitor.

The invention claimed is:

1. A method of determining a state or a state change of an electrochemical energy storage device comprising:
  a composite of at least one positive sheet-like electrode, at least one negative sheet-like electrode and at least one separator layer,
  a housing composed of a multilayer composite film, wherein the housing comprises a first housing part and a second housing part composed of the multilayer composite film, which parts are joined to one another, and together enclose a hollow space in which the composite is arranged, and
  the composite film comprises a ply composed of a metal layer and also two plies composed of polymer, with the metal layer being arranged between the two polymer plies, wherein
  to determine the state or the state change, an electric potential is applied to the metal layers of the first housing part and the second housing part so that an electric field arises between the metal layers and an electrical parameter influenced by a change of a spacing between the metal layers is determined.

2. The method as claimed in claim 1, further comprising at least one of:
  to determine the state or the state change, an electrical capacitance between the metal layer of the first housing part and the metal layer of the second housing part or a change in capacitance is determined as an electrical parameter, to determine the state or the state change, an electric potential prevailing between the metal layers or a change in the potential is determined as an electrical parameter, and to determine the state or the state change, a capacitive impedance of the metal layers forming the electric field or a change in this impedance is determined as an electrical parameter.

3. The method as claimed in claim 1, further comprising one of:

the state is a charging state of the electrochemical energy storage device, the state is an incorrect state as a result of a temperature increase or gas formation in the electrochemical energy storage device, the state is a temperature of the electrochemical energy storage device, the state is the qualitative state of an adhesive or sealing layer between the first housing part and the second housing part, and the state is the qualitative state of the plies composed of polymer of the composite film of the first housing part or the second housing part.

4. The method as claimed in claim 2, further comprising one of:

the state is a charging state of the electrochemical energy storage device, the state is an incorrect state as a result of a temperature increase or gas formation in the electrochemical energy storage device, the state is a temperature of the electrochemical energy storage device, the state is the qualitative state of an adhesive or sealing layer between the first housing part and the second housing part, and the state is the qualitative state of the plies composed of polymer of the composite film of the first housing part or the second housing part.

\* \* \* \* \*